United States Patent
Kim et al.

(10) Patent No.: US 7,592,663 B2
(45) Date of Patent: Sep. 22, 2009

(54) FLASH MEMORY DEVICE UTILIZING NANOCRYSTALS EMBEDDED IN POLYMER

(75) Inventors: Tae-Whan Kim, Seoul (KR); Young-Ho Kim, Seoul (KR); Chong-Seung Yoon, Seoul (KR); Jae-Ho Kim, Seoul (KR); Jae-Hun Jung, Seoul (KR); Sung-Keun Lim, Seoul (KR); Mun-Seop Song, Iksan-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 8 days.

(21) Appl. No.: 11/540,991

(22) Filed: Sep. 28, 2006

(65) Prior Publication Data
US 2007/0034933 A1    Feb. 15, 2007

Related U.S. Application Data

(63) Continuation of application No. PCT/KR2005/000161, filed on Jan. 18, 2005.

(30) Foreign Application Priority Data

Mar. 29, 2004   (KR) ................. 10-2004-0021073
Nov. 3, 2004    (KR) ................. 10-2004-0088769

(51) Int. Cl.
*H01L 29/788* (2006.01)

(52) U.S. Cl. .................. 257/315; 257/E29.3; 977/773; 977/777; 977/779; 977/943

(58) Field of Classification Search ............ 257/321, 257/325, 410, 411, 315, E29.3, E29.304; 438/261, 781; 977/773, 777–779, 785, 943
See application file for complete search history.

(56) References Cited

U.S. PATENT DOCUMENTS 6,090,666 A    7/2000    Ueda et al.

(Continued)

FOREIGN PATENT DOCUMENTS

JP    2000-340682    12/2000

(Continued)

OTHER PUBLICATIONS

Lim et al., Synthesis of iron oxide nanoparticles in a polyimide matrix, Feb. 25, 2004, J. Colloid Interface Sci., 273, 517-522.*

(Continued)

*Primary Examiner*—Anh Phung
*Assistant Examiner*—Michael Lulis
(74) *Attorney, Agent, or Firm*—Volentine & Whitt, PLLC

(57) ABSTRACT

A flash memory device with a nanoscale floating gate and a method of manufacturing thereof are disclosed. At least one embodiment of the present invention provides a much simpler and easier method of manufacturing nanocrystals (or nanocrystallines) for the flash memory device than the conventional method. Since the nanocrystals are homogeneously dispersed as a polymer layer without agglomeration, size and density of the nanoparticles may be controlled. Additionally, one embodiment of the present invention provides memory devices with nanoscale floating gates, and related methods of manufacture, of high efficiency and cost effectiveness by employing electrically and chemically more stable nanoscale floating gates compared to conventional ones.

1 Claim, 6 Drawing Sheets

U.S. PATENT DOCUMENTS

| | | |
|---|---|---|
| 6,441,417 B1 | 8/2002 | Zhang et al. |
| 2003/0034486 A1* | 2/2003 | Korgel .................. 257/13 |
| 2004/0004245 A1 | 1/2004 | Forbes et al. |
| 2004/0013009 A1 | 1/2004 | Tsunoda et al. |
| 2007/0102750 A1* | 5/2007 | Kim et al. .............. 257/314 |
| 2009/0001346 A1* | 1/2009 | Kim et al. .............. 257/4 |

FOREIGN PATENT DOCUMENTS

| | | |
|---|---|---|
| KR | 2001-0001057 | 1/2001 |
| KR | 2003-0072549 | 9/2003 |
| WO | WO 03/094257 A1 | 11/2003 |

OTHER PUBLICATIONS

Lim et al., Characterization of Nanoparticles Fabricated by Oxidation of Ni80Fe20 and Co80Fe20 Thin Films during Imidization, Nov. 3, 2004, J. Phys. Chem. B 2004, 108, 18179-18184.*

Kim et al., Formation and electrical properties of Ni1-xFex nanocrystals embedded in a polyimide layers for applications as nonvolatile flash memories, Jan. 10, 2005, Applied Physics Letters 86, 032904.*

Lim et al., Mono-layer of Ni100-xFex nanoparticles fabricated on a polyimide film under different curing atmospheres, Aug. 19, 2005, Journal of Colloid and Interface Science 295 (2006) 108-114.*

Notice of Preliminary Rejection by Korean Intellectual Property Office on Apr. 26, 2006.

Notice of Preliminary Rejection by Korean Intellectual Property Office on Dec. 12, 2005.

New Non-Volatile Memory with Extremely High Density Metal Nano-Dots, 2003.

Chinese Office Action dated Jul. 4, 2008 with partial English Translation.

Sung K. Lim et al., "Synthesis of iron oxide nanoparticles in a polyimide matrix," Journal of Colloid and Interface Science 273 (2004), pp. 517-522.

* cited by examiner

FLASH MEMORY DEVICE UTILIZING NANOCRYSTALS EMBEDDED IN POLYMER

RELATED APPLICATIONS

This application is a continuation application, and claims the benefit under 35 U.S.C. §§ 120 and 365 of PCT Application No. PCT/KR2005/000161, filed on Jan. 18, 2005, which is hereby incorporated by reference.

BACKGROUND OF THE INVENTION

1. Field of the Invention

The present invention relates to a flash memory device with a nanoscale floating gate and a method of manufacturing thereof, and more particularly, a flash memory device with a nanoscale floating gate that utilizes self-assembled nanocrystals embedded in a polymer film.

2. Description of the Related Technology

A flash memory is produced by combining a small cell area of an erasable programmable ROM (EPROM) with the electrical erasability of an electrically erasable programmable ROM (EEPROM) to be erased and reprogrammed in blocks unlike the EEPROM so that it can be easily rewritten and work much faster.

A flash memory is used in a variety of electronic equipments such as nearly all main board BIOS chips, mobile telephones, set-top boxes, digital cameras, DVD players, MP3 players, games and the like.

Three-dimensionally confined nanocrystallines embedded in a dielectric layer have been investigated extensively for the applications in nonvolatile flash memories with nanoscale gates. Even though some studies concerning the formation of Si nanoparticles embedded in a $SiO_2$ have been conducted using scanning prove, e-beam, and X-ray methods (S. Huang, S. Banerjee, R. T. Tung, and S. Oda, *J. Appl. Phys.* 94, 7261 (2003), S. J. Lee, Y. S. Shim, H. Y. Cho, D. Y. Kim, T. W. Kim, and K. L. Wang, Jpn. *J. Appl. Phys.* 42, 7180 (2003), S. Huang, S. Banerjee, R. T. Tung, and S. Oda, *J. Appl. Phys.* 93, 576 (2003)), a study of self-assembled nanoparticles embedded in an alternative insulation layer by using simple techniques has not been performed yet.

Demand for replacing $SiO_2$, which has been mainly used as a dielectric layer in present, with novel materials is increased. Polyimide as an organic dielectric insulation material is developed to replace conventional inorganic dielectric insulation materials. Since polyimide exhibits characteristics of thermal, mechanical, inherent properties, it has been widely used in a variety of ultra-precision electronic industries including insulating intermediate layers of integrated circuits, high density interconnecting packages. Particularly, it is noted that a dielectric constant of polyimide is lower than that of the conventional inorganic material.

The flash memory device generally comprises a thin tunnel oxide on the silicon substrate, a floating gate composed of polysilicons thereon, an insulation layer between gate electrodes formed on the floating gate electrode, and a control gate electrode permitted for an appropriate voltage.

The drawback of conventional tunnel oxide is that it requires a complex manufacturing process and high programming voltage.

SUMMARY OF CERTAIN INVENTIVE ASPECTS

One aspect of the present invention provides techniques able to easily control size or density of particles and nanomaterials able to transmit electrons on the substrate at a low voltage in next-generation flash memories.

Another aspect of the present invention provides a flash memory device with nanoscale floating gate of highly efficient and cost effective by employing metal or metal oxide nanocrystallines, wherein the nanocrystallines are easily formed in polymer by simple vaporization and heat treatment without the formation of tunnel oxide layer in order to resolve the drawback described above.

Another aspect of the present invention provides a flash memory device comprising i) a semiconductor substrate, ii) a drain region and a source region which are formed in the active region but separated each other, and iii) a channel region between the drain region and the source region, wherein the channel region is formed close to the source region and comprises a floating gate composed with metal or metal oxide nanocrystallines in a polymer thin film and a control gate formed on the floating gate and electrically isolated by the polymer thin film.

The metal or metal oxide nanocrystallines in the polymer thin film may be formed in a single layer of multiple layers.

In one embodiment, the polymer thin film is a polyimide thin film.

Examples of the metal oxide include zinc oxide, copper oxide, iron oxide, cadmium oxide, cobalt oxide, bismuth oxide, nickel oxide, indium oxide, and tin oxide, and examples of the metal include copper, zinc, tin, cobalt, iron, cadmium, lead, magnesium, barium, molybdenum, indium, nickel, tungsten, bismuth, silver, manganese, and a mixture thereof.

Another aspect of the present invention provides a method of manufacturing a flash memory device comprising forming a floating gate composed of metal or metal oxide nanocrystallines in an dielectric polymer thin film on a semiconductor substrate and forming a source region and a drain region at the both end of the floating gate and a control gate on the polymer thin layer In one embodiment, the forming the floating gate comprises coating with metal over the semiconductor substrate, spin coating with an acidic precursor containing dielectric polymer dissolved in solvent over the metal-coated layer and removing the remained solvent, and heating to obtain cross-linking bonds between the coated polymers.

The forming the floating gate may further comprise spin coating with an acidic precursor containing dielectric polymer dissolved in solvent over the semiconductor substrate and removing the remained solvent before coating with metal over the semiconductor substrate.

In one embodiment, the metal coated over the semiconductor substrate is chosen from copper, zinc, tin, cobalt, iron, cadmium, lead, magnesium, barium, molybdenum, indium, nickel, tungsten, bismuth, silver, manganese, and a mixture thereof and the acidic precursor is an acidic precursor having carboxyl group.

The metal alloy may be $Ni_{1-x}Fe_x$, wherein X is $0<x<0.5$.

After the cross-linking bonding, the coated metal may form metal oxide nanocrystallines in the polymer thin film if it reacts with the acidic precursor containing dielectric polymer. On the other hand, it may form metal nanocrystallines if it is stable and thus has low activity.

The metal may be coated by evaporation or sputtering which is well known.

Examples of the solvent include N-metyl-2-pyrrolidone (NMP), water, N-dimethylacetamide, diglyme, and a mixture thereof.

In one embodiment, the forming the floating gate comprises coating with at least one metal or alloy with a thickness of about 1 nm to about 30 nm over the substrate by any deposition method, spin coating with a precursor of biphenyltetracaboxylic dianhydide-p-phenylenediamine (BPDA-PDA) type polyamic acid in N-metyl-2-pyrrolidone (NMP) over the metal-coated substrate, and curing the coated layer at about 300- about 400° C. for about 1 hour.

According to at least one embodiment of the present invention, it allows the formation of the floating gate with high density nanocrystallines embedded in the polyimide thin film and further easily to control size and density of the nanocrystallines by controlling kind of metal, initial coated thickness of metal, mixing ratio of solvent and a precursor, curing condition and the like.

In one embodiment, general permittivity of polyimides is about 2.9 and the polyimide replaces conventional tunnel oxide layer. The nanocrystallines embedded in the polyimide may be used as a floating gate. Thus, the thickness of the flash memory device can be reduced since it is not necessary to form a separate tunnel oxide layer.

DETAILED DESCRIPTION OF CERTAIN INVENTIVE EMBODIMENTS

Embodiments of the present invention will be described in more detail by accompanying drawings

EXAMPLE 1

Preparation of ZnO Nanocrystallines Embedded in the Polyimide Matrix

Figure 1:
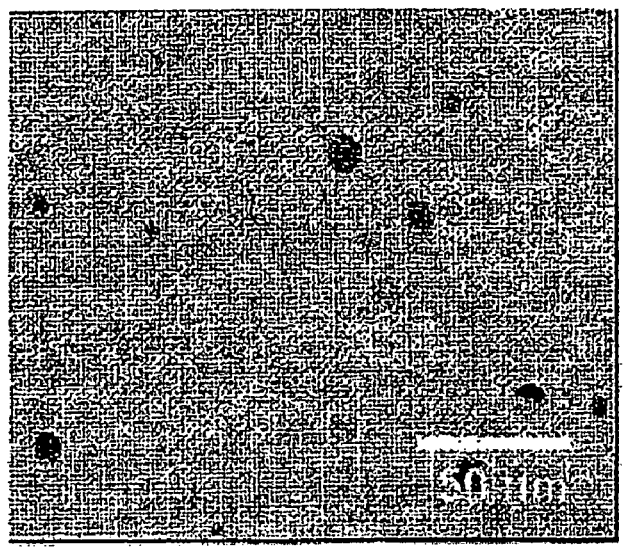
FIG. 1 is a transmission electron microscopy (TEM) micrograph of ZnO nanocrystallines embedded in the polyimide.
Figure 2:
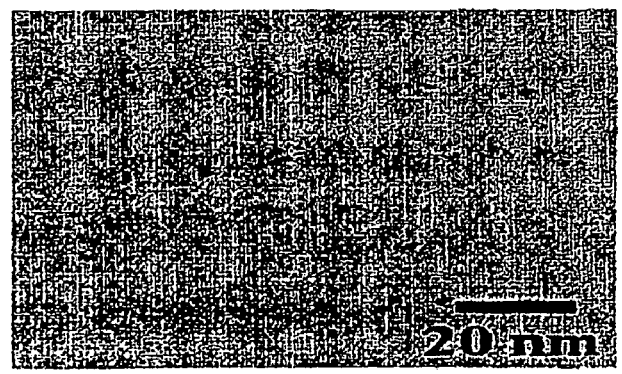
FIG. 2 is a TEM microghraph of the sectional view of the polyimide film containing ZnO nanocrystallines.

Zn film was deposited on Si substrate to be a thickness of about 10 nm and PI precursor which is biphenyltetracaboxylic dianhydide-p-phenylenediamine (BPDA-PDA) type polyamic acid in N-metyl-2-pyrrolidone (NMP) (about 1:3 ratio by weight) was then spin coated onto the Si substrate. After evaporating the solvent, the thin film was cured at about 400° C. for about 1 hour under $N_2$ atmosphere to polymerize the polyamic acid into the corresponding polyimide. The nanocrystallines embedded in the polyimide was prepared and formation and size of the oxide nanoparticle (ZnO) were verified using transmission electron microscopy (TEM) which is shown in FIG. 1. The particle size of ZnO was not larger than about 10 nm and thickness of the polymer film was 80 nm which was verified with α-step profiler and TEM. FIG. 2 is a sectional view of the polymer film which proves that multiple layers of the ZnO nanocrystallines were formed homogeneously and no metal was remained between the Si substrate layer and the polyimide layer. A layer above the polyimide layer was an epoxy layer to observe TEM.

EXAMPLE 2

Preparation of $Cu_2O$ Nanocrystallines Embedded in the Polyimide Matrix

Figure 3:
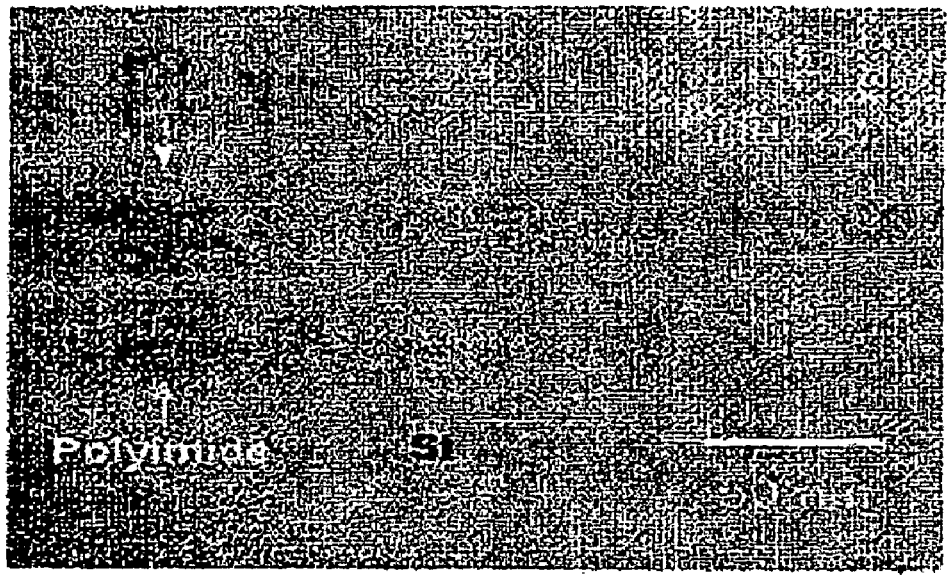
FIG. 3 is a TEM micrograph of $Cu_2O$ nanocrystallines embedded in the polyimide.

Cu film was deposited on Si substrate to be a thickness of about 5 nm and PI precursor which is biphenyltetracaboxylic dianhydide-p-phenylenediamine (BPDA-PDA) type polyamic acid in N-metyl-2-pyrrolidone (NMP) (about 1:3 ratio by weight) was then spin coated onto the Si substrate. After evaporating the solvent, the thin film was cured at about 350° C. for about 1 hour under $N_2$ atmosphere to polymerize the polyamic acid into the corresponding polyimide. The nanocrystallines embedded in the polyimide was prepared and formation and size of the oxide nanoparticle ($Cu_2O$) were verified using transmission electron microscopy (TEM) which is shown in FIG. 3. The particle size of $Cu_2O$ was about 5 nm and thickness of the polymer film was about 60 nm which was verified with α-step profiler and TEM.

EXAMPLE 3

Preparation of $SnO_2$ Nanocrystallines Embedded in the Polyimide Matrix

Su film was deposited on Si substrate to be a thickness of about 5 nm and PI precursor which is biphenyltetracaboxylic dianhydide-p-phenylenediamine (BPDA-PDA) type polyamic acid in N-metyl-2-pyrrolidone (NMP) (about 1:3 ratio by weight) was then spin coated onto the Si substrate. After evaporating the solvent, the thin film was cured at about 400° C. for about 1 hour under $N_2$ atmosphere to polymerize the polyamic acid into the corresponding polyimide. The nanocrystallines embedded in the polyimide was prepared and formation and size of the oxide nanoparticle ($SnO_2$) were verified using transmission electron microscopy (TEM). The thickness of the polymer film was 60 nm which was verified with α-step profiler and TEM.

EXAMPLE 4

Preparation of $Ni_{1-x}Fe_x$ Nanocrystallines Embedded in the Polyimide Matrix

PI precursor which is biphenyltetracaboxylic dianhydide-p-phenylenediamine (BPDA-PDA) type polyamic acid in N-metyl-2-pyrrolidone (NMP) (about 1:3 ratio by volume) was spin coated onto the Si substrate. The solvent was removed at about 135° C. for about 30 min. $Ni_{0.8}Fe_{0.2}$ film was deposited with a thickness of about 5 nm on the PI-precursor-coated substrate by sputtering. Another PI precursor layer was spin coated and the result was then kept at the room temperature for about 2 hours. The $PI/Ni_{0.8}Fe_{0.2}/PI/n$-Si sample was heated at about 135° C. for about 30 min to remove any remained solvent and further cured at about 400° C. for 1 hour under the pressure of $10^{-3}$ Pa to polymerize polyamic acid into polyimide. The PI layer deposited first was used as a tunneling barrier and second as an insulating layer.

Figure 4:
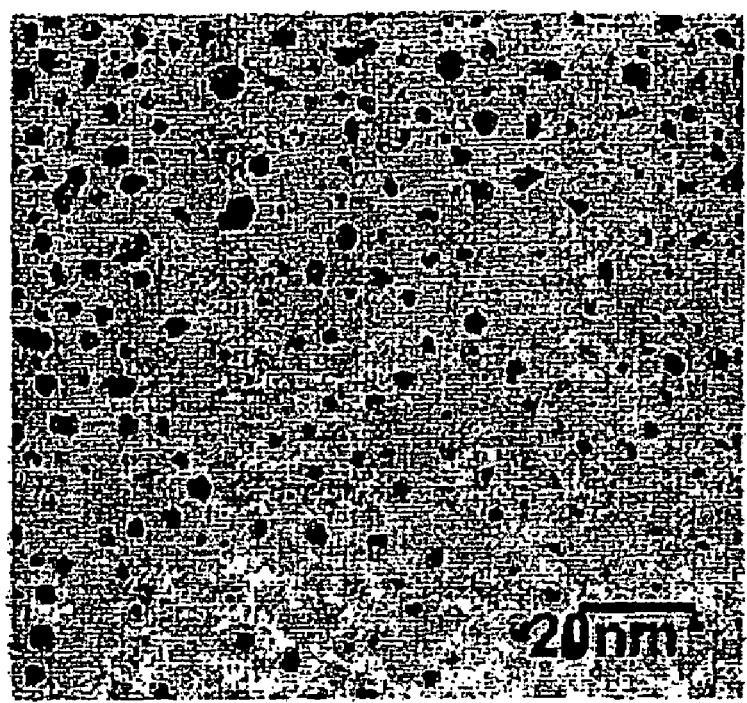
FIG. 4 is a TEM micrograph of $Ni_{1-x}Fe_x$ nanocrystallines embedded in the polyimide (above: ground, below: section).
Figure 4:
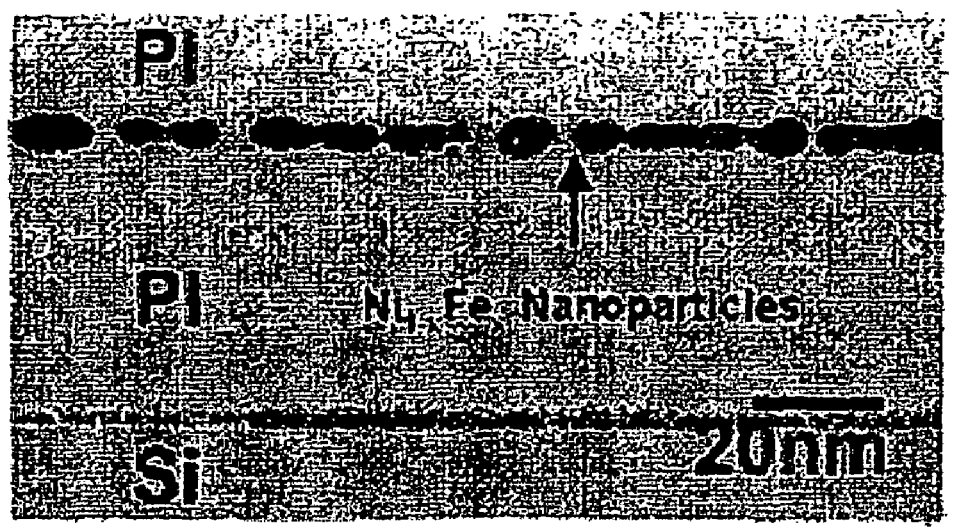

The $Ni_{0.8}Fe_{0.2}$ nanocrystallines embedded in the PI prepared above was observed with TEM performed in a JEM 2010 JEOL of which result was shown in FIG. 4. According to a plan-view-bright-field TEM image of FIG. 4, the $Ni_{1-x}Fe_x$ nanocrystallines embedded in the PI matrix was formed, the size of the nanoparticles was not larger than about 4-6 nm, and the surface density of the nanoparticles was approximately $2\times10^{12} cm^{-2}$. Referring to a cross-sectional bright-field TEM image of FIG. 4, the $Ni_{1-x}Fe_x$ nanocrystallines is located in a monolayer.

The lateral size of the $Ni_{1-x}Fe_x$ nanoparticles is in the range from about 4 nm to about 6 nm and the thickness of both lower tunnel-barrier PI layer and top gate PI layer is approximately 40 nm.

EXAMPLE 5

SADP of $Ni_{1-x}Fe_x$ Nanocrystallines Embedded in the Polyimide Matrix

Figure 5:
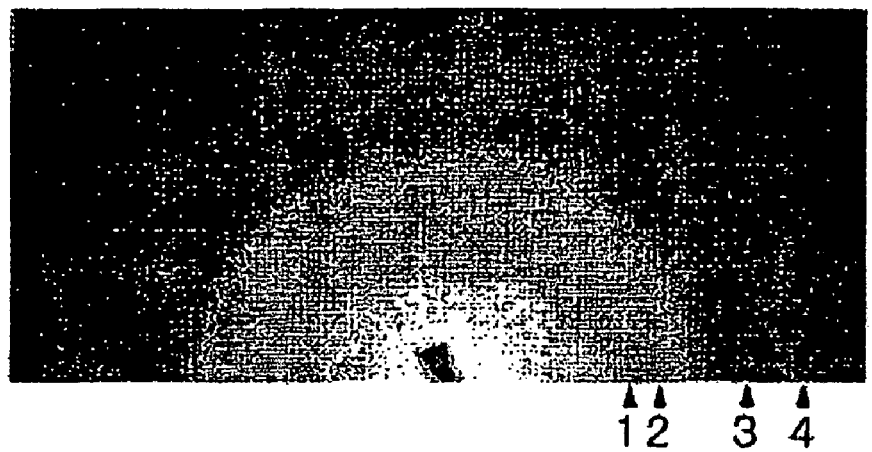
FIG. 5 is a selected area electron diffraction pattern of $Ni_{1-x}Fe_x$ nanocrystallines embedded in the polyimide.

FIG. 5 is selected area electron diffraction (SADP) pattern of the $Ni_{1-x}Fe_x$ nanocrystallines embedded in the PI matrix. The SADP was indexed a faxe-centered cubic structure and has diffuse rings due to the small particle size.

Figure 6:
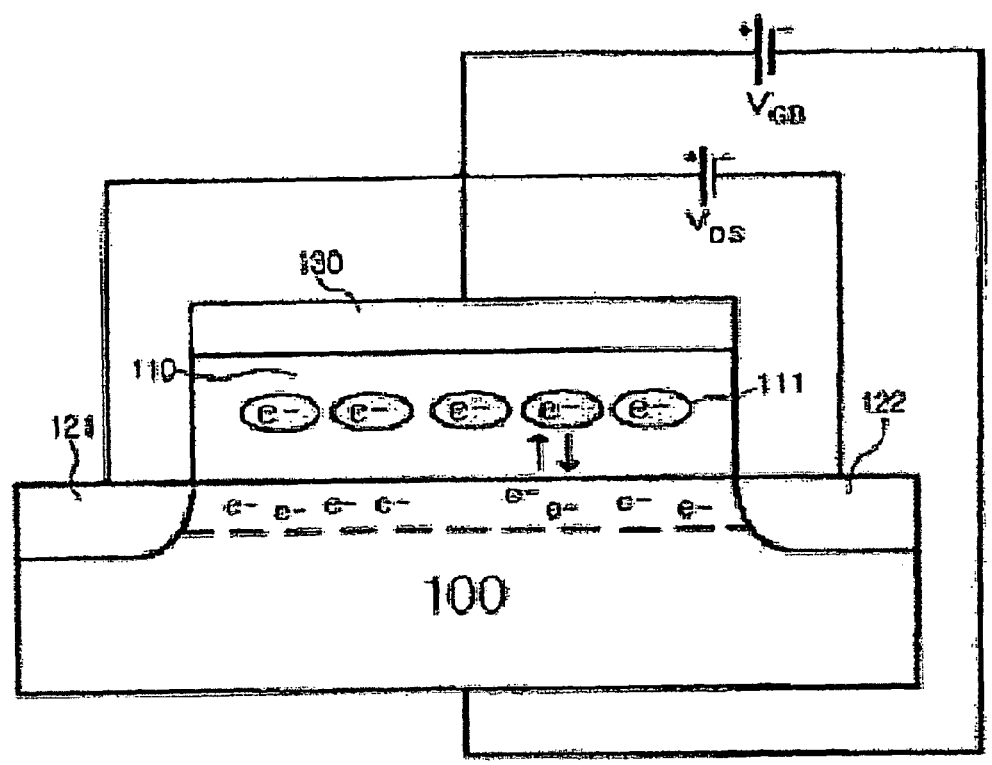
FIG. 6 is a schematic diagram for the flash memory device with nanoscale floating gate by utilizing $Ni_{1-x}Fe_x$ composite embedded in the polyimide.

FIG. 6 is an outline drawing of the flash memory device with $Al/PI/Ni_{1-x}Fe_x$ nanocrystallines/PI/n-Si structure according to one embodiment of the present invention. Referring to FIG. 6, after the acid precursor of polyimide was dissolved in NMP, the solution was spin coated on the P-type impurity-doped Si substrate 100 and heated to layer polyimide matrix 110. Further, $Ni_{0.8}Fe_{0.2}$ layer was deposited thereon by sputtering. And then another polyimide layer was formed with the same procedure described above. After evaporating the remained solvent, the sample was cured at about 400° C. for about 1 hour to polymerize polyamice acid into polyimide which is further reacted with $Ni_{0.8}Fe_{0.2}$ to provide $Ni_{0.8}Fe_{0.2}$ nanocrystallines. At this time, the $Ni_{0.8}Fe_{0.2}$ nanocrystallines was homogeneously distributed in the polyimide matrix 110. Source and drain regions 121, 122 were formed at the both end of the polyimide matrix and a control gate 130 composed of a metal gate including Al was formed on the polyimide matrix 110.

In case of 'write' process on the memory device, electrons on the substrate were captured inside the nanocrystallines through transmission by employing positive voltage to $V_{GB}$ and the gate voltage of the cell was positive value. On the other hand, in case of 'erase' process, they were transmitted from the nanocrystallines to the substrate through reverse transmission by employing negative voltage to $V_{GB}$ and the gate voltage of the cell was negative value. In case of 'read' process, a drain current was determined depending on the gate voltage either positive or negative when negative voltage was applied to $V_{DS}$ and 0V to $V_{GS}$ and then depending on the result, the drain voltage was determined to either "1" or "0".

EXAMPLE 7

Capacitance-Voltage Characteristics for $Al/PI/Ni_{1-x}Fe_x/PI/n$-Si

Figure 7:
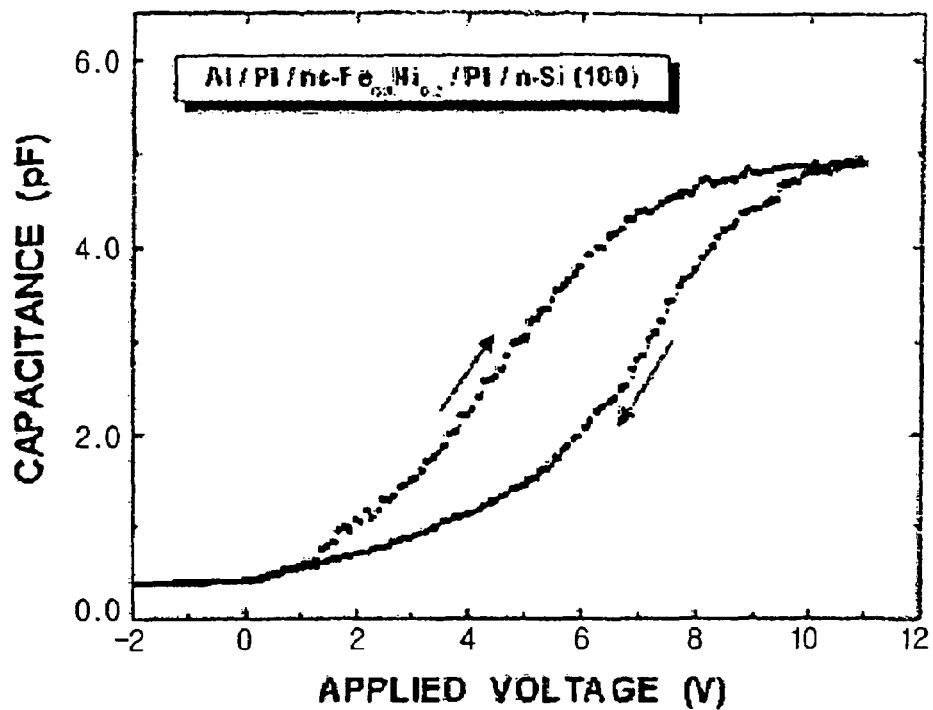
FIG. 7 is a graph illustrating capacitances determined with applying voltage to the flash memory device prepared according to one embodiment of the present invention.

FIG. 7 is a graph illustrating capacitance-voltage characteristics for $Al/polyimide/Ni_{1-x}Fe_x$nano/polyimide/n-Si 100 structure with a nanoscale floating gate by utilizing $Ni_{1-x}Fe_x$nanocrystallines prepared in Example 6. Arrow 1 was capacitance-voltage value with applying voltage for the forward direction, and arrow 2 for the reverse direction. The C-V curve showed similar C-V value for a metal-insulator-semiconductor (MIS) memory device with a floating gate utilized with nanocrystallines having an electric charge trap region. A clockwise hysteresis, which is observed in the C-V characteristics, proved that electrons were trapped in the embedded nanocrystallines.

EXAMPLE 8

Conductance-Voltage Characteristics for $Al/PI/Ni_{1-x}Fe_x/PI/n$-Si

Figure 8:
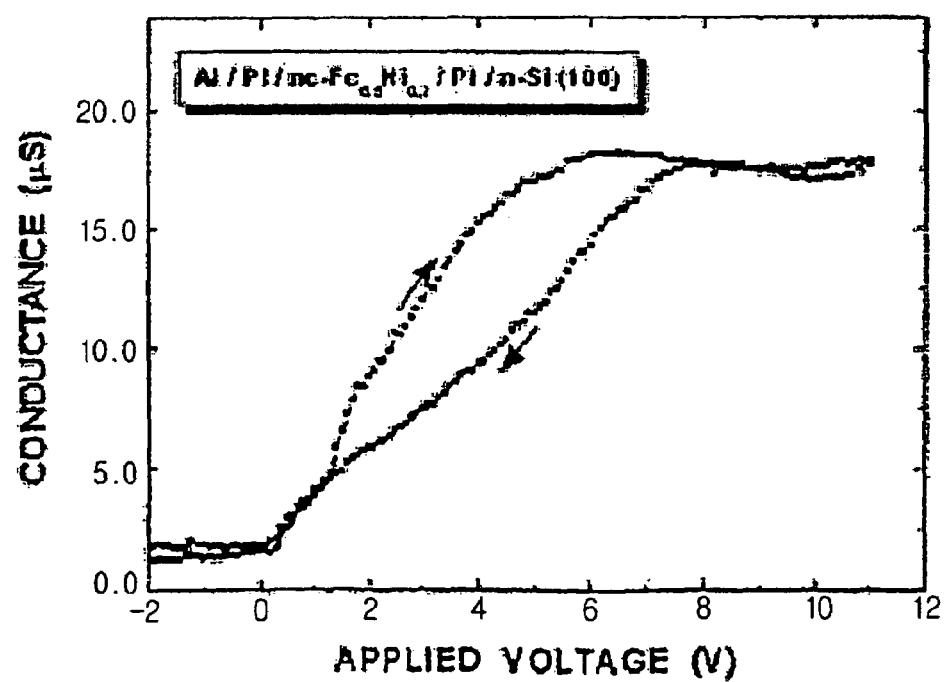
FIG. 8 is a graph illustrating conductances determined with applying voltage to the flash memory device prepared according to one embodiment of the present invention.

FIG. 8 is a graph illustrating conductance-voltage characteristics for $Al/polyimide/Ni_{1-x}Fe_x$ nanocrystallines/polyimide/n-Si 100 structure with a nanoscale floating utilized with $Ni_{1-x}Fe_x$nanocrystallines prepared in Example 6. A broad peak close to the flatband voltage in both the forward and backward measurements was existed which relates to energy loss of the $Ni_{1-x}Fe_x$ nanocrystallines. This result indicated that the $Al/polyimide/Ni_{1-x}Fe_x$ nanocrystallines/polyimide/n-Si 100 structure might be used as a floating gate in nonvolatile single electron memory devices. It is truly remarkable that the lower 40 nm-thick polyimide layer is used as a tunneling layer compared to the conventional 2 nm-thick tunneling layer.

At least one embodiment of the present invention provides much simpler and easier method for manufacturing nanocrystallines for the flash memory device than the conventional method. Since the nanocrystallines is homogeneously dispersed as a polymer layer without agglomeration, size and density of the nanoparticles may be controlled. Further, another embodiment of the present invention allows lowering operation voltage with reducing the thickness of the flash memory device since it does not require a separate tunneling layer.

Additionally, one embodiment of the present invention provides memory devices with nanoscale floating gates of high efficient and cost effective and the method for manufacturing the same by employing electrically and chemically more stable nanoscale floating gates compared to the conventional ones, which are suitable for information, electronics and telecommunication industries.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A flash memory device comprising,
   a semiconductor substrate;
   a drain region and a source region, separated from each other, which are located in an active region of the semiconductor substrate, wherein a channel region is defined between the drain and source regions;
   a polymer thin film located on the semiconductor substrate;
   a floating gate comprised of at least one of metal and metal oxide nanocrystallines embedded in the polymer thin film, the floating gate aligned over the channel region; and
   a control gate located directly on the polymer thin film,
   wherein the floating gate is comprised of metal nanocrystallines, and the metal is $Ni_{1-x}Fe_x$ ($0<x<0.5$).

* * * * *